United States Patent
Kim et al.

(10) Patent No.: US 9,406,639 B2
(45) Date of Patent: Aug. 2, 2016

(54) SEMICONDUCTOR PACKAGE AND MANUFACTURING METHOD THEREOF

(71) Applicant: Amkor Technology, Inc., Tempe, AZ (US)

(72) Inventors: Jin Young Kim, Seoul (KR); No Sun Park, Gwangji-si (KR); Yoon Joo Kim, Seoul (KR); Choon Heung Lee, Seoul (KR); Jin Han Kim, Namyangju-si (KR); Seung Jae Lee, Namyangju-si (KR); Se Woong Cha, Gwangju-si (KR); Sung Kyu Kim, Seoul (KR); Glenn Rinne, Apex, NC (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/962,735

(22) Filed: Aug. 8, 2013

(65) Prior Publication Data

US 2014/0042600 A1 Feb. 13, 2014

(30) Foreign Application Priority Data

Aug. 8, 2012 (KR) .......................... 10-2012-0086904

(51) Int. Cl.
*H01L 23/48* (2006.01)
*H01L 23/00* (2006.01)
(Continued)

(52) U.S. Cl.
CPC ................. *H01L 24/73* (2013.01); *H01L 23/00* (2013.01); *H01L 23/3135* (2013.01);
(Continued)

(58) Field of Classification Search
CPC .................. H01L 25/0657; H01L 2224/48091; H01L 2924/15311; H01L 2924/14; H01L 2224/16; H01L 2924/01079; H01L 2924/01078

USPC .................................................. 257/666–796
See application file for complete search history.

(56) References Cited

U.S. PATENT DOCUMENTS 5,250,843 A 10/1993 Eichelberger
5,353,498 A 10/1994 Fillion et al.
(Continued)

FOREIGN PATENT DOCUMENTS

JP 2001118947 10/1999
KR 200412028 3/2006
(Continued)

OTHER PUBLICATIONS

CAD_CIM Requirements Article IMAPS.

*Primary Examiner* — Cuong Q Nguyen
*Assistant Examiner* — Nishath Yasmeen
(74) *Attorney, Agent, or Firm* — McAndrews, Held & Malloy, Ltd.

(57) ABSTRACT

A semiconductor package and manufacturing method thereof are disclosed and may include a first semiconductor device comprising a first bond pad on a first surface of the first semiconductor device, a first encapsulant material surrounding side edges of the first semiconductor device, and a redistribution layer (RDL) formed on the first surface of the first semiconductor device and on a first surface of the encapsulant material. The RDL may electrically couple the first bond pad to a second bond pad formed above the first surface of the encapsulant material. A second semiconductor device comprising a third bond pad on a first surface of the second semiconductor device may face the first surface of the first semiconductor device and be electrically coupled to the first bond pad on the first semiconductor device. The first surface of the first semiconductor device may be coplanar with the first surface of the encapsulant material.

29 Claims, 11 Drawing Sheets

(51) Int. Cl.
  *H01L 23/31* (2006.01)
  *H01L 25/065* (2006.01)
(52) U.S. Cl.
  CPC .............. *H01L 24/19* (2013.01); *H01L 24/81* (2013.01); *H01L 25/0657* (2013.01); *H01L 2224/0401* (2013.01); *H01L 2224/04105* (2013.01); *H01L 2224/12105* (2013.01); *H01L 2224/16145* (2013.01); *H01L 2224/48227* (2013.01); *H01L 2224/73209* (2013.01); *H01L 2224/73267* (2013.01); *H01L 2924/1461* (2013.01); *H01L 2924/18162* (2013.01); *H01L 2924/19107* (2013.01)

(56) References Cited

U.S. PATENT DOCUMENTS

| | | | |
|---|---|---|---|
| 5,497,033 | A | 3/1996 | Fillion et al. |
| 5,841,193 | A | 11/1998 | Eichelberger |
| 6,159,767 | A | 12/2000 | Eichelberger |
| 6,486,005 | B1 | 11/2002 | Kim |
| 6,727,576 | B2 | 4/2004 | Hedler |
| 6,838,776 | B2 | 1/2005 | Leal |
| 6,845,554 | B2 | 1/2005 | Frankowsky et al. |
| 6,905,914 | B1 | 6/2005 | Huemoeller et al. |
| 6,921,975 | B2 | 7/2005 | Leal |
| 7,015,075 | B2 | 3/2006 | Fay et al. |
| 7,192,807 | B1 | 3/2007 | Huemoeller et al. |
| 7,196,408 | B2 | 3/2007 | Yang et al. |
| 7,202,107 | B2 | 4/2007 | Fuergut et al. |
| 7,238,602 | B2 | 7/2007 | Yang |
| 7,247,523 | B1 | 7/2007 | Huemoeller et al. |
| 7,262,081 | B2 | 8/2007 | Yang et al. |
| 7,326,592 | B2 | 2/2008 | Meyer et al. |
| 7,339,279 | B2 | 3/2008 | Yang |
| 7,361,987 | B2 | 4/2008 | Leal |
| 7,405,102 | B2 | 7/2008 | Lee et al. |
| 7,420,272 | B1 | 9/2008 | Huemoeller et al. |
| 7,459,781 | B2 | 12/2008 | Yang et al. |
| 7,623,733 | B2 | 11/2009 | Hirosawa |
| 2006/0192301 | A1 | 8/2006 | Leal et al. |
| 2006/0231958 | A1 | 10/2006 | Yang |
| 2007/0059866 | A1 | 3/2007 | Yang et al. |
| 2008/0105967 | A1 | 5/2008 | Yang et al. |
| 2008/0128884 | A1 | 6/2008 | Meyer et al. |
| 2008/0142960 | A1 | 6/2008 | Leal |
| 2008/0182363 | A1 | 7/2008 | Amrine et al. |
| 2009/0051025 | A1 | 2/2009 | Yang et al. |
| 2009/0168380 | A1* | 7/2009 | Hsu ............... H01L 23/5389 361/761 |
| 2010/0213589 | A1* | 8/2010 | Hsieh ............. H01L 21/4832 257/676 |
| 2011/0074018 | A1* | 3/2011 | Fukuda ........... H01L 23/3128 257/737 |
| 2011/0156250 | A1* | 6/2011 | Goh ................ H01L 25/16 257/738 |

FOREIGN PATENT DOCUMENTS

| | | |
|---|---|---|
| KR | 1020070028715 A | 3/2007 |
| KR | 1020120027962 A | 3/2012 |
| KR | 1020120032772 A | 4/2012 |

* cited by examiner

SEMICONDUCTOR PACKAGE AND MANUFACTURING METHOD THEREOF

CROSS REFERENCE TO RELATED APPLICATIONS

The present application makes reference to, claims priority to, and claims the benefit of Korean Patent Application No. 10-2012-0086904, filed on Aug. 8, 2012, the contents of which are hereby incorporated herein by reference, in their entirety.

FIELD OF THE INVENTION

Certain embodiments of the invention relate to semiconductor chip packaging. More specifically, certain embodiments of the invention relate to a semiconductor package and manufacturing method thereof.

BACKGROUND OF THE INVENTION

Along with the demand for miniaturization and high performance of electric and electronic products, a variety of techniques for providing high-capacity semiconductor modules are currently being researched and developed. One example attempt to provide high-capacity semiconductor modules is to increase the capacity of a memory chip, that is, to provide for high integration of memory chips. The high integration of memory chips may be achieved by integrating as many cells as possible in a limited space of semiconductor chips.

The high integration of memory chips requires advanced techniques, for example, a technique for a precise, small line width, and a need of a substantial amount of time for development.

Another method for providing high-capacity semiconductor modules is to stack semiconductor dies. Here, a memory chip is stacked on a logic chip, and the logic chip may be electrically connected to a high-priced silicon interposed or a printed circuit board. However, as the capacity of memory is increased, the number of I/O pads of the memory chip may also be increased, making the memory chip bulky. Thus, it is difficult to stack the memory chip on the logic chip having a limited size.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A semiconductor package and manufacturing method therefor, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Figure 1:
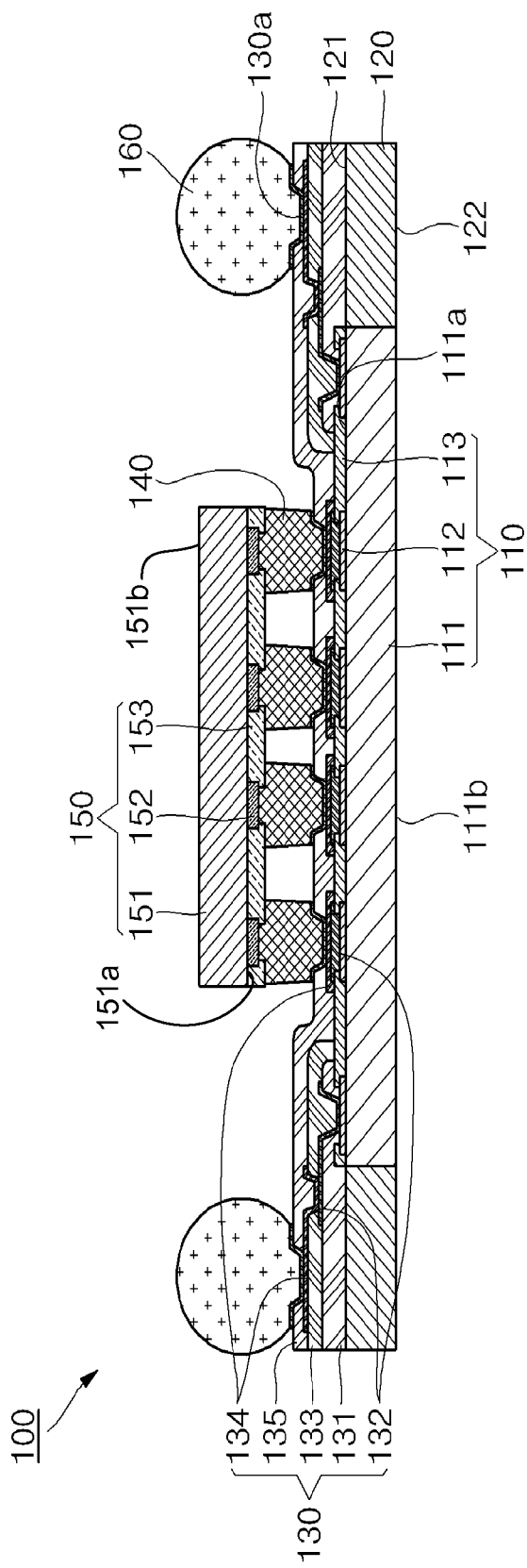
FIG. 1 is a cross-sectional view of a semiconductor package according to an example embodiment of the present invention.

Certain aspects of the invention may be found in a semiconductor package and manufacturing method thereof. Example aspects of the invention may comprise a first semiconductor device comprising a first bond pad and a second bond pad on a first surface of the first semiconductor device, a first encapsulant material surrounding side edges of the first semiconductor device, and at least one redistribution layer (RDL) formed on the first surface of the first semiconductor device and on a first surface of the encapsulant material. The at least one RDL may electrically couple the first bond pad to a third bond pad formed above the first surface of the encapsulant material. A second semiconductor device comprising a fourth bond pad on a first surface of the second semiconductor device may face the first surface of the first semiconductor device and be electrically coupled to the second bond pad on the first semiconductor device. The fourth bond pad may be electrically coupled to the second bond pad utilizing a conductive bump. The first surface of the first semiconductor device may be coplanar with the first surface of the encapsulant material. A conductive bump formed on the third bond pad may be electrically coupled to the first bond pad via the at least one RDL. The first semiconductor device may comprise a logic chip and the second semiconductor device may comprise a memory chip. A second surface of the first semiconductor device opposite to the first surface may be coupled to a circuit board. A conductive wire may electrically couple the third bond pad to a bonding area on the circuit board. The first semiconductor die, the at least one RDL, the second semiconductor device, and the top surface of the circuit board may be covered with a second encapsulant material. The first and second encapsulant materials may comprise an epoxy-series resin.

Aspects of the present invention provide a semiconductor package and a manufacturing method thereof, which can improve a signal transfer rate and performance by directly connecting devices through a redistribution layer without using a high-priced interposer or a printed circuit board.

Aspects of the present invention also provide a semiconductor package and a manufacturing method thereof, which can achieve high performance and miniaturization of devices by reducing the thickness of the package by designing input/output pads through a redistribution layer without a separate board between first and second semiconductor devices.

According to an aspect of the present invention, there is provided a semiconductor package including a first semiconductor device having a plurality of first bond pads formed on its first surface, a first encapsulant formed to surround side portions of the first semiconductor device, one or more redistribution layers formed on the first surface of the first semiconductor device to be electrically connected to the plurality of first bond pads of the first semiconductor device, respectively, and a second semiconductor device having a plurality of second bond pads formed on a second surface facing the first surface of the first semiconductor device, the plurality of second bond pads electrically connected to the plurality of first bond pads through the redistribution layers.

Each of the redistribution layers formed on the first surface of the first semiconductor device may further include a first conductive bump. The first conductive bump may be interposed between the second bond pads and the redistribution layers and may electrically connect the first semiconductor device to the second semiconductor device. At least one of the redistribution layers may extend to a first surface of the first encapsulant, which is coplanar with the first surface of the first semiconductor device.

The semiconductor package may further include a second conductive bump formed on the redistribution layer extending to the first surface of the first encapsulant. The semiconductor package may further include a conductive wire bonded to the redistribution layer extending to the first surface of the first encapsulant.

The conductive wire may electrically connect the redistribution layer to a board having bonding areas. The semiconductor package may further include a second encapsulant formed to cover the first semiconductor device, the second semiconductor device, the redistribution layer, the first encapsulant, the conductive wire and the bonding areas of the board.

The redistribution layer may include a first passivation layer formed on the first surface of the first semiconductor device and exposing portions of the first bond pads to the outside, a first redistribution layer formed on the first passivation layer to be electrically connected to the first bond pad; a second passivation layer formed on the first redistribution layer and the first passivation layer to expose a portion of the first redistribution layer to the outside; a second redistribution layer formed on the second passivation layer to be electrically connected to the exposed first redistribution layer; and a third passivation layer formed on the second redistribution layer and the second passivation layer to expose a portion of the second redistribution layer.

According to another aspect of the present invention, there is provided a manufacturing method of a semiconductor package, where the method comprises performing first encapsulation using a first encapsulant to cover all of side surfaces of a first semiconductor device having a plurality of first bond pads formed on its first surface and a second surface opposite to the first surface; forming a redistribution layer on the first surface of the first semiconductor device and a first surface of the first encapsulant that is coplanar with the first surface of the first semiconductor device to be electrically connected to the plurality of first bond pads of the first semiconductor device; forming a first conductive bump on the redistribution layer formed on the first surface of the first semiconductor device; and mounting a second semiconductor device on the first surface of the first semiconductor device to allow a plurality of second bond pads of the second semiconductor device to make contact with the first conductive bump.

The manufacturing method may further comprise, after the performing of the first encapsulation, performing back grinding to remove the first encapsulant covering the second surface of the first semiconductor device so as to expose the second surface of the first semiconductor device to the outside.

The manufacturing method may further comprise, before the mounting of the second semiconductor device, forming a second conductive bump on the redistribution layer formed on the first surface of the first encapsulant.

The manufacturing method may further comprise, after the mounting of the second semiconductor device, mounting the first semiconductor device electrically connected to the second semiconductor device and the second semiconductor devices on the board having the bonding areas; performing wire bonding to the redistribution layer formed on the first surface of the first encapsulant to the bonding areas of the board using a conductive wire; and performing second encapsulation using a second encapsulant formed to cover the first semiconductor device, the second semiconductor device, the redistribution layer, the first encapsulant, the conductive wire and the bonding areas of the board.

The forming of the redistribution layer may comprise forming a first passivation layer on the first surface of the first semiconductor device to expose portions of the first bond pads to the outside; forming a first redistribution layer on the first passivation layer to be electrically connected to the first bond pad; forming a second passivation layer on the first redistribution layer and the first passivation layer to expose a portion of the first redistribution layer to the outside; forming a second redistribution layer on the second passivation layer to be electrically connected to the exposed first redistribution layer; and forming a third passivation layer on the second redistribution layer and the second passivation layer to expose a portion of the second redistribution layer.

In the semiconductor package and the manufacturing method thereof as described herein, a signal transfer rate and performance can be improved by directly connecting devices through a redistribution layer without using a high-priced interposer or a printed circuit board.

In addition, in the semiconductor package and the manufacturing method thereof as described herein, high performance and miniaturization of devices can be achieved by reducing the thickness of the package by designing input/output pads through a redistribution layer without a separate board between first and second semiconductor devices.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Common reference numerals are used throughout the drawings and the detailed description to indicate the same elements.

Referring to FIG. 1, a cross-sectional view of a semiconductor package according to an example embodiment of the present invention is illustrated.

As illustrated in FIG. 1, the semiconductor package 100 may include a first semiconductor device 110, a first encapsulant 120, redistribution layers 130, a first conductive bump 140, a second semiconductor device 150, and a second conductive bump 160.

The first semiconductor device 110 includes a first semiconductor die 111 having a planar first surface 111a and a second surface 111b opposite to the first surface 111a, and a plurality of first bond pads 112 formed on the first surface 111a of the first semiconductor die 111. The first semiconductor device 110 may further include a first pad passivation layer 113 formed on the first surface 111a of the first semiconductor die 111 to expose portions of the first bond pads 112. The first pad passivation layer 113 may be formed on the first surface 111a of the first semiconductor die 111 to surround outer circumferential edges of the first bond pads 112. The first semiconductor die 111 may be a logic chip. The first surface 111a of the first semiconductor die 111 may correspond to a first surface of the first semiconductor device 110 and will be referred to as the first surface 111a of the first semiconductor device 110 hereinafter.

The first encapsulant 120 is formed to surround side surfaces of the first semiconductor device 110. Here, first and second surfaces 121 and 122 of the first encapsulant 120 are coplanar with the first and second surfaces 111a and 111b of the first semiconductor device 110. The first encapsulant 120 may protect the first semiconductor device 110 from external shocks and may comprise an epoxy-series resin that is an electrically insulating material.

Since the first encapsulant 120 is formed at the side portions of the first semiconductor device 110, it may extend the redistribution layers 130 electrically connected to the first bond pads 112 of the first semiconductor device 110 beyond the exterior sides of the side portions of the first semiconductor device 110.

The redistribution layers 130 are formed on the first surface 111a of the first semiconductor device 110 to be electrically connected to the first bond pads 112 of the first semiconductor device 110. In addition, at least one of the redistribution layers 130 may extend to the first surface 121 of the first encapsulant 120 that is coplanar with the first surface 111a of the first semiconductor device 110. That is to say, the redistribution layers 130 are formed on the first surface 111a of the first semiconductor device 110, and at least one of the redistribution layers 130 may extend to the first surface 121 of the first encapsulant 120. The redistribution layers 130 may be formed to change positions of bond pads of the respective devices or to change the number of I/O pads. The redistribution layers 130 may be formed by photolithography, and may allow the I/O pads to be easily designed.

The first conductive bump 140 is formed on the redistribution layer 130 positioned on the first surface 111a of the first semiconductor device 110, and the second conductive bump 160 is formed on the redistribution layer 130 positioned on the first surface 121 of the first encapsulant 120. Here, the redistribution layer 130 formed on the first surface 111a of the first semiconductor device 110 is electrically connected to the second semiconductor device 150 through the first conductive bump 140.

The redistribution layer 130 may include a first passivation layer 131, first redistribution layers 132, a second passivation layer 133, second redistribution layers 134 and a third passivation layer 135, which are sequentially stacked on the first surface 111a of the first semiconductor device 110.

The first passivation layer 131 is formed on the first surface 111a of the first semiconductor device 110 and exposes portions of the first bond pads 112 of the first semiconductor device 110. The exposed first bond pads 112 are electrically connected to the first redistribution layers 132 formed on the first passivation layer 131. That is to say, the first passivation layer 131 may be interposed between the plurality of first bond pads 112 and a plurality of first redistribution layers 132 to electrically isolate the plurality of first bond pads 112 and the first redistribution layers 132 from each other. Some portions to be electrically connected may be opened, and the first bond pads 112 and the first redistribution layers 132 may be electrically connected through the opened portions. The first passivation layer 131 may be generally made of at least one of polyimide, epoxy, benzocyclobutene (BCB), polybenzoxazole (PBO) and equivalents thereof, but the invention does not limit the material to those listed herein.

The first redistribution layers 132 may be formed on the first passivation layer 131 to make contact with the exposed first bond pads 112. At least one of the first redistribution layers 132 may extend from the first surface 111a of the first semiconductor device 110 to the first surface 121 of the first encapsulant 120. That is to say, the first redistribution layers 132 are connected to the first bond pads 112 to be electrically connected thereto. The first redistribution layers 132 may be made of gold (Au), silver (Ag), nickel (Ni) or equivalents thereof, but the invention does not limit the material to those listed herein.

The second passivation layer 133 may be formed on the first redistribution layers 132 and the first passivation layer 131 to expose some of the first redistribution layers 132 to the outside. The exposed first redistribution layers 132 are electrically connected to the second redistribution layers 134. That is to say, the second passivation layer 133 may be interposed between the plurality of first redistribution layers 132 and the plurality of second redistribution layers 134 to electrically isolate the plurality of first redistribution layers 132 and the plurality of second redistribution layers 134 from each other. Some portions to be electrically connected may be opened, and the first redistribution layers 132 and the second redistribution layers 134 electrically connected through the opened portions. The second passivation layer 133 may be made of the same material as the first passivation layer 131, but the invention does not limit the material to those listed herein.

The second redistribution layers 134 may be formed on the second passivation layer 133 to make contact with the exposed first redistribution layers 132. At least one of the second redistribution layers 134 may extend from the first surface 111a of the first semiconductor device 110 to the first surface 121 of the first encapsulant 120. That is to say, the second redistribution layers 134 are connected to the first bond pads 112 to be electrically connected thereto. The second redistribution layers 134 may be made of the same material as the first redistribution layers 132, but the invention does not limit the material to those listed herein.

The third passivation layer 135 may be formed on the second redistribution layers 134 and the second passivation layer 133 to expose some of the second redistribution layers 134 to the outside. The exposed second redistribution layers 134 may be electrically connected to the first conductive bump 140 or the second conductive bump 160. The third passivation layer 135 may protect the second redistribution layers 134 from external shocks and may be made of the same material as the first passivation layer 131, but the invention does not limit the material to those listed herein. Here, third passivation layer 135 may be positioned on the first surface 121 of the first encapsulant 120.

The first conductive bump 140 may be formed on the redistribution layer 130 corresponding to the first surface 111a of the first semiconductor device 110. That is to say, the first conductive bump 140 may be formed on the redistribution layer 130 positioned on the first semiconductor device 110. The first conductive bump 140 may be interposed between the redistribution layer 130 connected to the first semiconductor device 110 and the second semiconductor device 150 and electrically connects the first semiconductor device 110 to the second semiconductor device 150 through the redistribution layer 130. That is to say, the first semiconductor device 110 may be electrically connected to the second semiconductor device 150 through the redistribution layer 130 and the first conductive bump 140. The first conductive bump 140 may be made of at least one selected from the group consisting of metals, such as lead/tin (Pb/Sn) or leadless Sn, and equivalents thereof, but the invention does not limit the material to those listed herein.

The second semiconductor device 150 may comprise a second semiconductor die 151 having a planar first surface 151a and a second surface 151b opposite to the second surface 151a, and a plurality of second bond pads 152 formed on the first surface 151a of the second semiconductor die 151. The second semiconductor device 150 may comprise a second pad passivation layer 153 formed on the first surface 151a of the second semiconductor die 151 to expose a portion of the second bond pads 152. The second pad passivation layer 153 may be formed on the first surface 151a of the second semiconductor die 151 to surround outer circumferential edges of the second bond pads 152. The first surface 151a of the second semiconductor die 151 faces the first surface 111a of the first semiconductor device 110. The second bond pads 152 may be electrically connected to the first bond pads 112 of the first semiconductor device 110 through the first conductive bump 140 and the redistribution layer 130. The second semiconductor die 151 may be a memory chip. The first surface 151a of the second semiconductor die 151 may correspond to a first surface of the second semiconductor device 150 and will be referred to as the first surface 151a of the second semiconductor device 150 hereinafter.

It should be noted that the semiconductor devices 110 and 150 are not limited to memory and logic chips. For example, the semiconductor device 110 may be selected from: a sensor die, a micro-electro-mechanical system (MEMS) device, a power management chip, a logic chip, and a memory chip, for example, and the semiconductor device 150 may be a different type of device from the list to communicate with the other device.

The second conductive bump 160 may be formed on the redistribution layer 130 extending to the first surface 111a of the first semiconductor device 110. That is to say, the second conductive bump 160 may be formed on the redistribution layer 130 positioned on the first encapsulant 120. The second conductive bump 160 may comprise an output pad, which may be connected to an external board (not shown).

The semiconductor package 100 can improve a signal transfer rate and performance by directly connecting devices through a redistribution layer without using a costly interposer or a printed circuit board. In addition, the semiconductor package 100 can achieve high performance and miniaturization of devices by reducing the thickness of the package by designing input/output pads through a redistribution layer without a separate board between first and second semiconductor devices.

Figure 2:
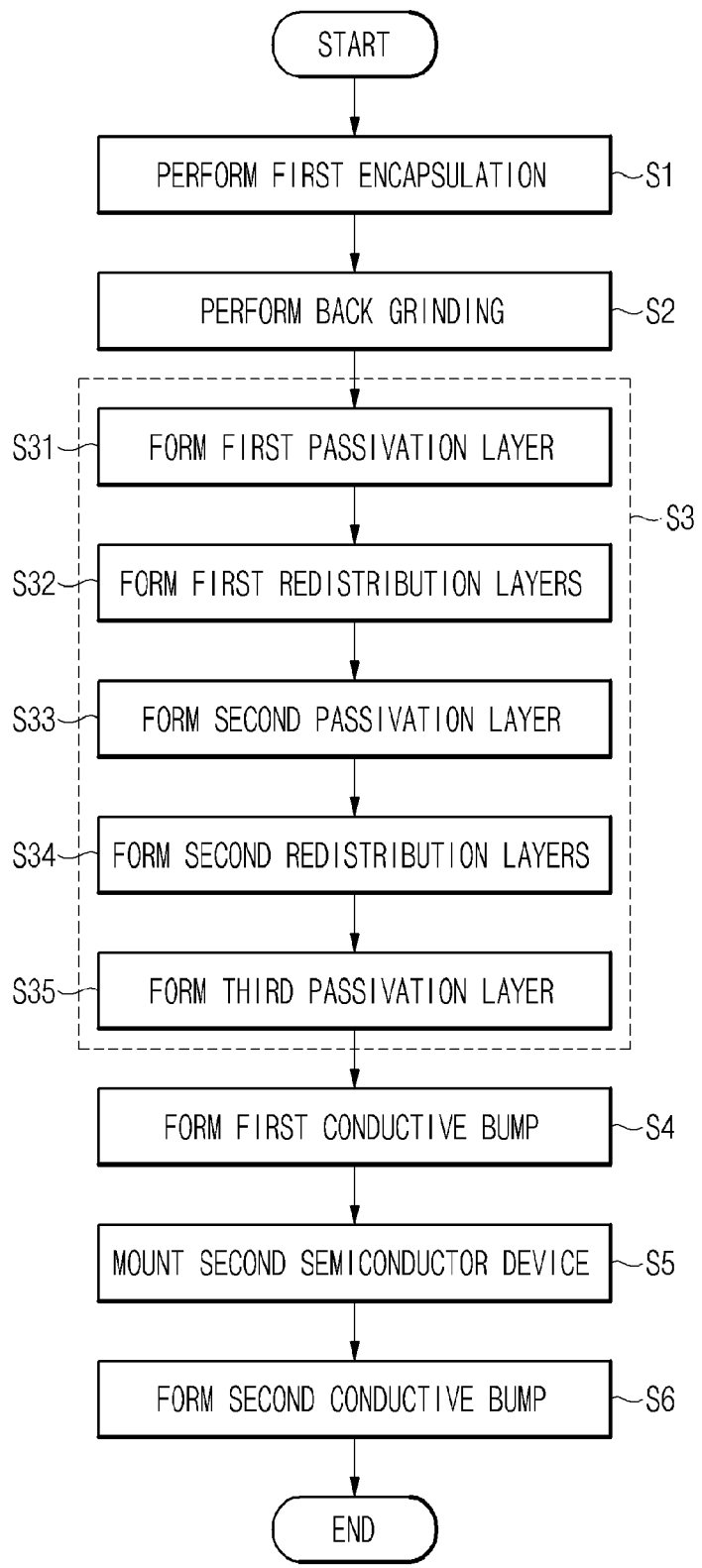
FIG. 2 is a flowchart of a manufacturing method of the semiconductor package shown in FIG. 1.

Referring to FIG. 2, a flowchart of a manufacturing method of the semiconductor package shown in FIG. 1 is illustrated.

The manufacturing method of the semiconductor package includes performing first encapsulation (S1), performing back grinding (S2), forming redistribution layers (S3), forming a first conductive bump (S4), mounting a second semiconductor device (S5) and forming a second conductive bump (S6).

The manufacturing method of the semiconductor package will now be described in more detail with reference to FIGS. 3A to 3H.

Figures 3A, 3B:
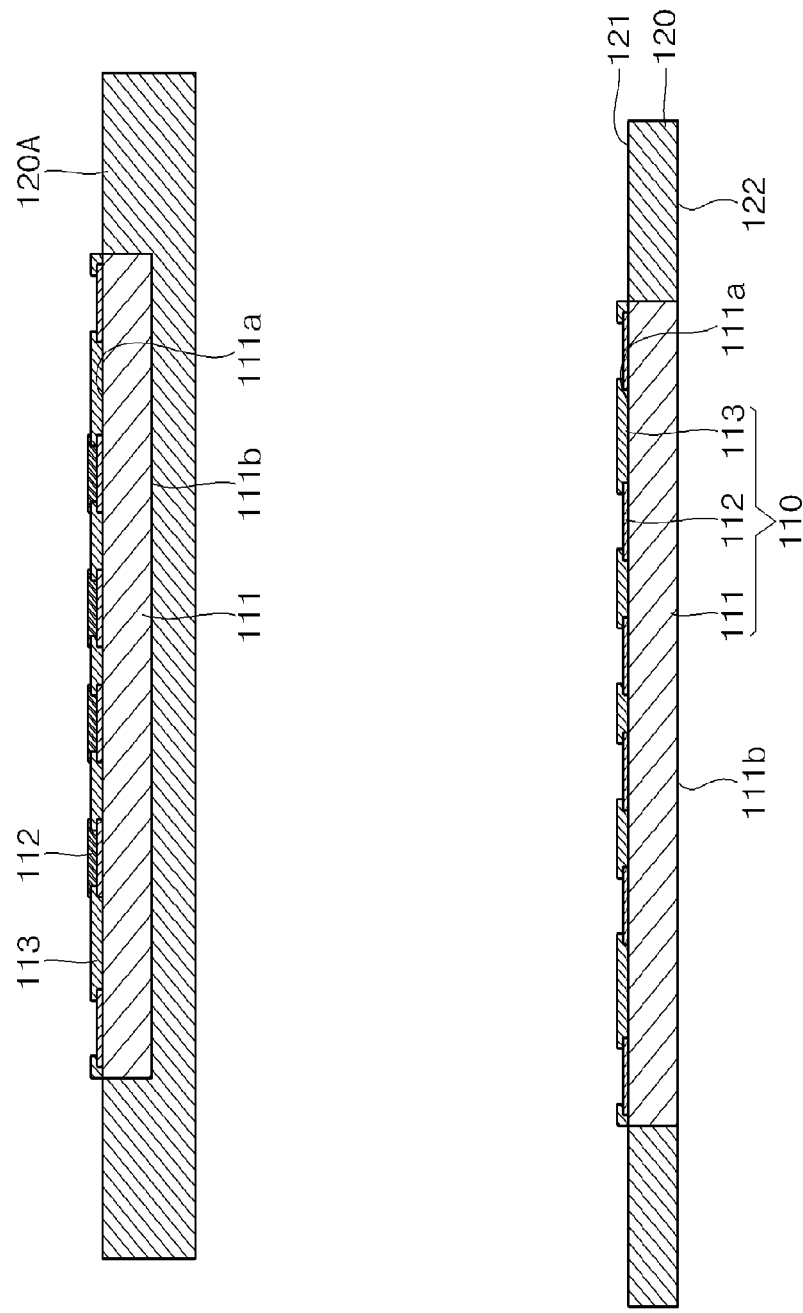
FIGS. 3A to 3H are cross-sectional views illustrating a manufacturing method of the semiconductor package shown in FIG. 2.

Referring to FIG. 3A, a cross-sectional view of the step of performing the first encapsulation (S1) in the manufacturing method of the semiconductor package is illustrated. In step S1, the first semiconductor device 110 may be encapsulated with a first encapsulant 120 to surround a second surface 111b opposite to a first surface 111a having a plurality of first bond pads 112 formed thereon and side surfaces of the first semiconductor device 110.

Referring to FIG. 3B, a cross-sectional view of the step of performing the back grinding (S2) in the manufacturing method of the semiconductor package is illustrated. In step S2, the first encapsulant 120 may be removed to expose the second surface 111b of the first semiconductor device 110 encapsulated by the first encapsulant 120 to the outside. That is to say, in step S2, a bottom surface of the first semiconductor device 110 may be subjected to back grinding to downwardly expose the second surface 111b of the first semiconductor device 110, thereby allowing only the side surfaces of the first semiconductor device 110 to be surrounded by the first encapsulant 120. Here, the first surface 111a of the first semiconductor device 110 and the first surface 121 of the first encapsulant 120 may be coplanar, and the second surface 111b of the first semiconductor device 110 and a second surface 122 of the first encapsulant 120 may be coplanar.

Figures 3C, 3D:
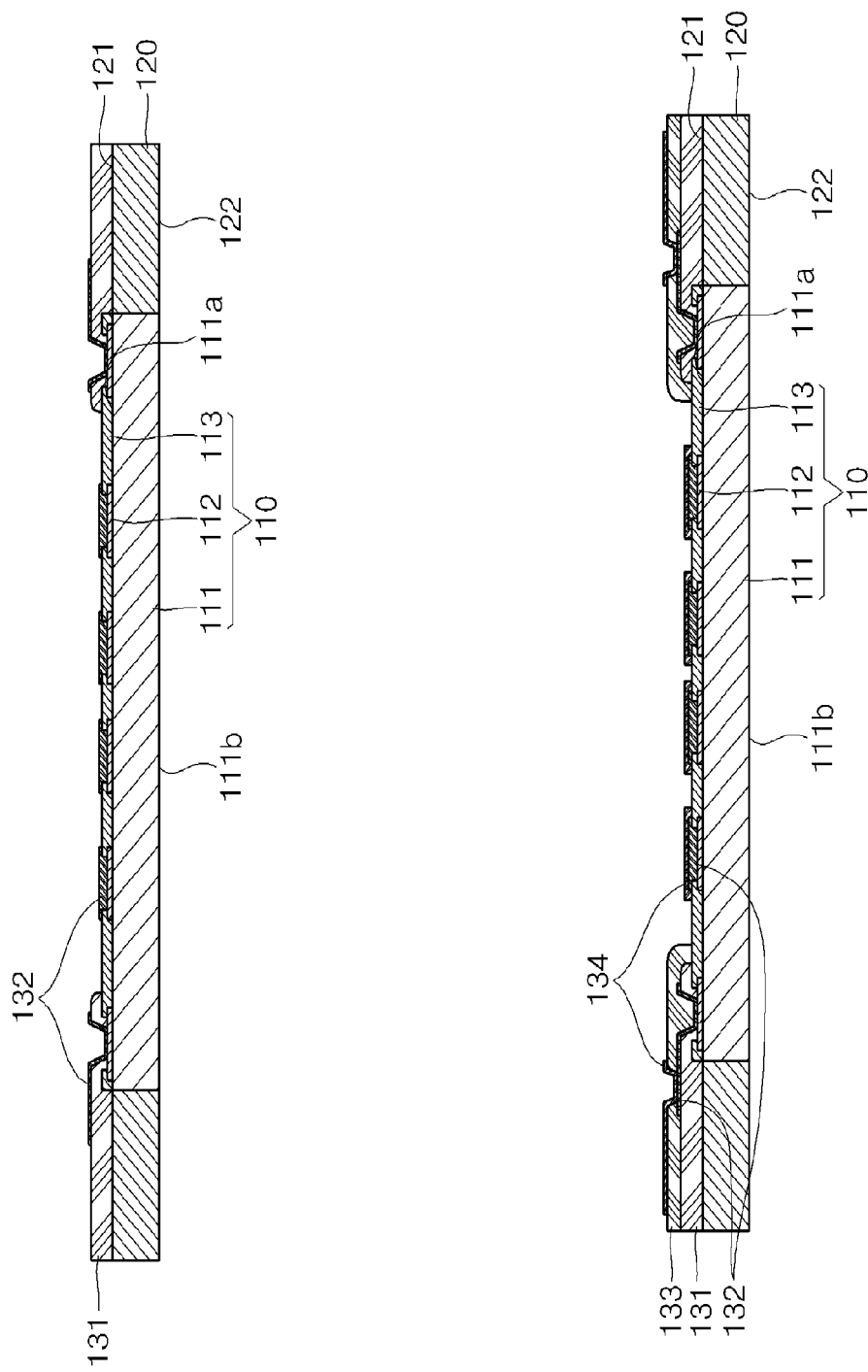
Figures 3E, 3F:
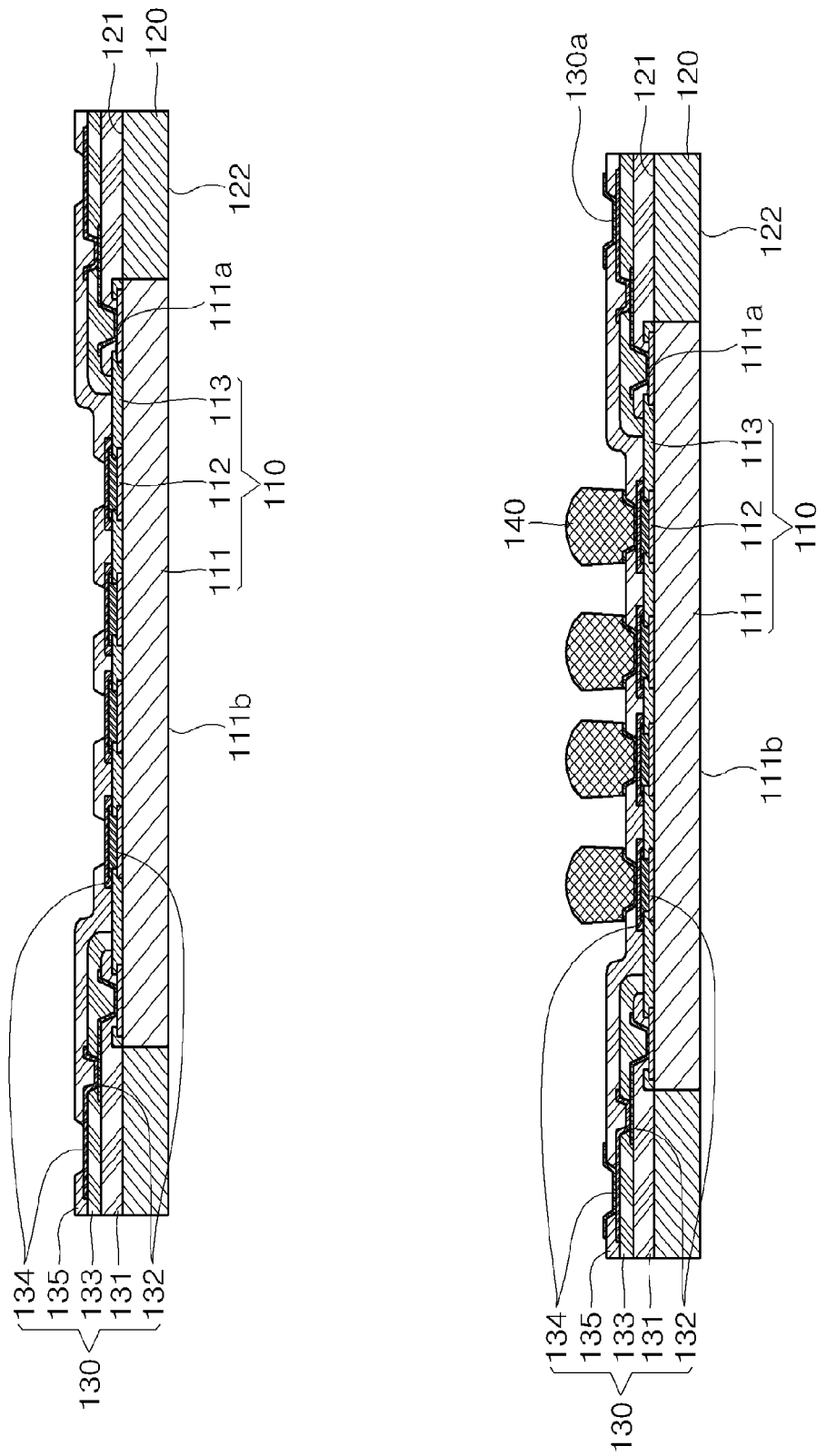

Referring to FIGS. 3C to 3E, cross-sectional views of the step of forming redistribution layers (S3) in the manufacturing method of the semiconductor package are illustrated. In step S3, a plurality of redistribution layers 130 may be formed on the first surface 111a of the first semiconductor device 110 to be electrically connected to the first bond pads 112 of the first semiconductor device 110. At least one of the redistribution layers 130 may extend to the first surface 121 of the first encapsulant 120 that is coplanar with the first surface 111a of the first semiconductor device 110. The step S3 may include forming first passivation layers (S31), forming first redistribution layers (S32), forming a second passivation layer (S33), second redistribution layers (S34) and forming a third passivation layer (S35).

In step S31 shown in FIG. 3C, the first passivation layer 131 is formed on the first surface 111a of the first semiconductor device 110 to expose a portion of the first bond pads 112 of the first semiconductor device 110. That is to say, the first passivation layer 131 is formed to cover the first surface 111a of the first semiconductor device 110, and a portion of the first passivation layer 131 is opened to expose a portion of the first bond pads 112 positioned thereunder to the outside.

In step S32 shown in FIG. 3C, the plurality of first redistribution layers 132 are formed on the first passivation layer 131 to make contact with the exposed first bond pads 112. That is to say, the plurality of first redistribution layers 132 are connected to the exposed first bond pads 112 to be electrically connected thereto. At least one of the plurality of first redistribution layers 132 may extend from the first surface 111a of the first semiconductor device 110 to the first passivation layer 131 formed on the first surface 121 of the first encapsulant 120.

In step S33 shown in FIG. 3D, the second passivation layer 133 is formed on the first redistribution layers 132 and the first passivation layer 131 to expose some of the first redistribution layers 132 to the outside. The exposed first redistribution layers 132 are electrically connected to the second redistribution layers 134. That is to say, the second passivation layer 133 may be formed to cover the plurality of first redistribution layers 132 and the plurality of second redistribution layers 134 and include one or more opened regions to expose some of the first redistribution layers 132 positioned under the second passivation layer 133 to a top portion of the second passivation layer 133.

In step S34 shown in FIG. 3D, the second redistribution layers 134 may be formed on the second passivation layer 133 to make contact with the plurality of first redistribution layers 132 exposed to the outside of the second passivation layer 133. At least one of the second redistribution layers 134 may be formed on the second passivation layer 133 formed on the first surface 121 of the first encapsulant 120.

In step S35 shown in FIG. 3E, the third passivation layer 135 may be formed on the second passivation layer 133 and the second passivation layer 133 to expose some of the second redistribution layers 134 to the outside. That is to say, the third passivation layer 135 may be formed to cover the second passivation layer 133 and the second redistribution layers 134 and include one or more opened regions to expose some portions of the second redistribution layers 134 to a top portion of the third passivation layer 135.

Referring to FIG. 3F, a cross-sectional view of the step of forming a first conductive bump (S4) in the manufacturing method of the semiconductor package is illustrated. In step S4, the first conductive bump 140 may be formed on the redistribution layer 130 positioned on the first surface 111a of the first semiconductor device 110. That is to say, in step S4, the first conductive bump 140 may be formed on the second redistribution layer 134 formed on the first semiconductor device 110, among the second redistribution layers 134 exposed to a top portion of the third passivation layer 135. The second conductive bump 160 may be electrically connected to the first semiconductor device 110 through the second redistribution layers 134, the first redistribution layers 132 and the first bond pads 112.

Figures 3G, 3H:
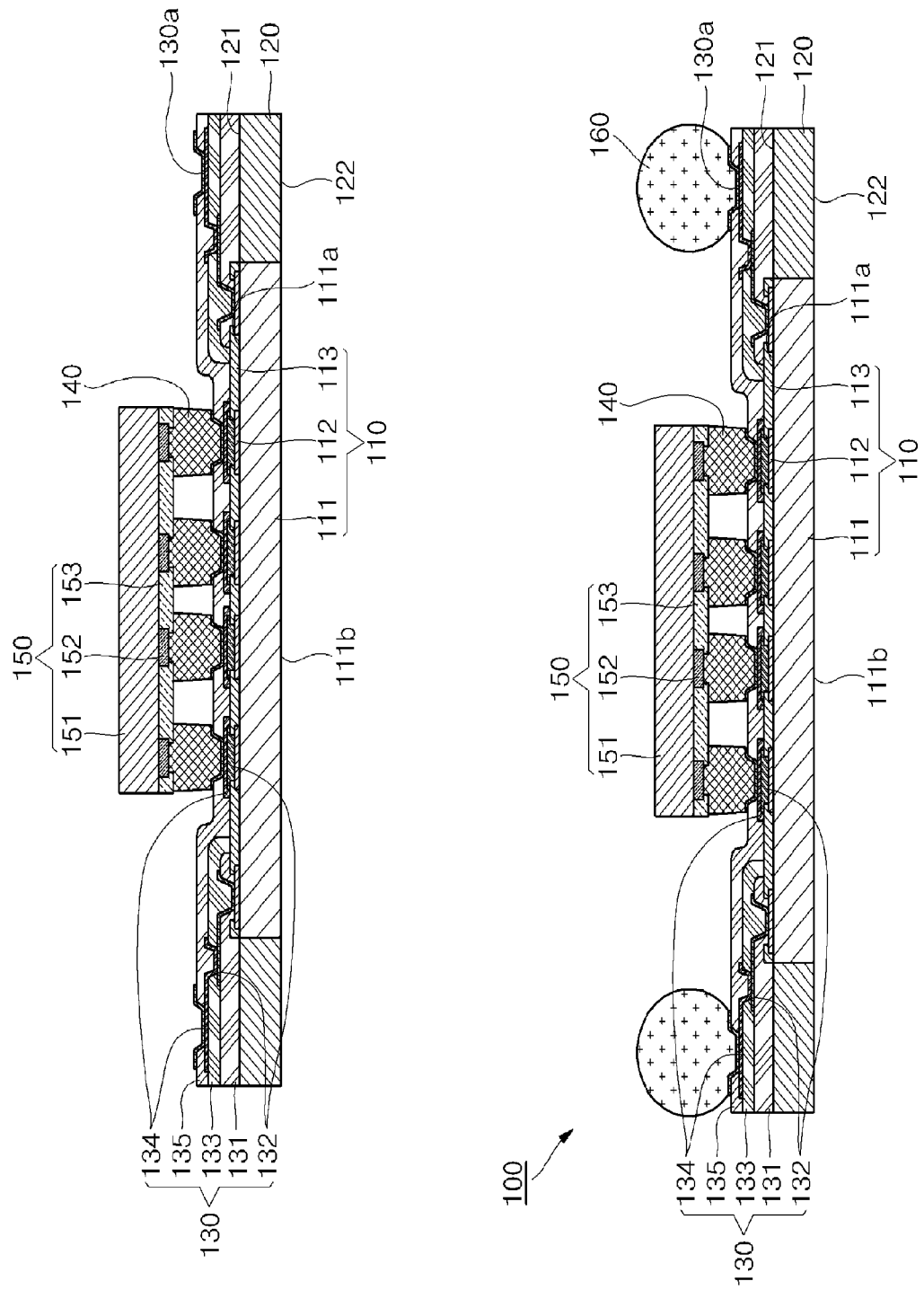

Referring to FIG. 3G, a cross-sectional view of the step of mounting a second semiconductor device (S5) in the manufacturing method of the semiconductor package is illustrated. In step S5, the second semiconductor device 150 may be mounted on the first surface 111a of the first semiconductor device 110 to electrically connect the second bond pads 152 of the second semiconductor device 150 to the first conductive bump 140. That is to say, in step S5, the second semiconductor device 150 may be mounted on the first semiconductor device 110 to electrically connect the second bond pads 152 to the first bond pads 112 of the first semiconductor device 110 through the first conductive bump 140 and the redistribution layer 130.

Referring to FIG. 3H, a cross-sectional view of the step of forming a second conductive bump (S6) in the manufacturing method of the semiconductor package is illustrated. In step S6, the second conductive bump 160 may be formed on the second redistribution layer 134 formed on the first surface 121 of the first encapsulant 120, among the second redistribution layers 134. That is to say, in step S6, the second conductive bump 160 may be formed on the second redistribution layer 134 formed on the first encapsulant 120, among the second redistribution layers 134 exposed to a top portion of the third passivation layer 135. The second conductive bump 160 may be made of the same material as the conductive bump 140, for example, and may be formed at the same time when the first conductive bump 140 is formed. The second conductive bump 160 may be electrically connected to the first bond pads 112 of the first semiconductor device 110 through the redistribution layers 130. The second conductive bump 160 may comprise an output pad, which may be connected to an external board (not shown).

Figure 4:
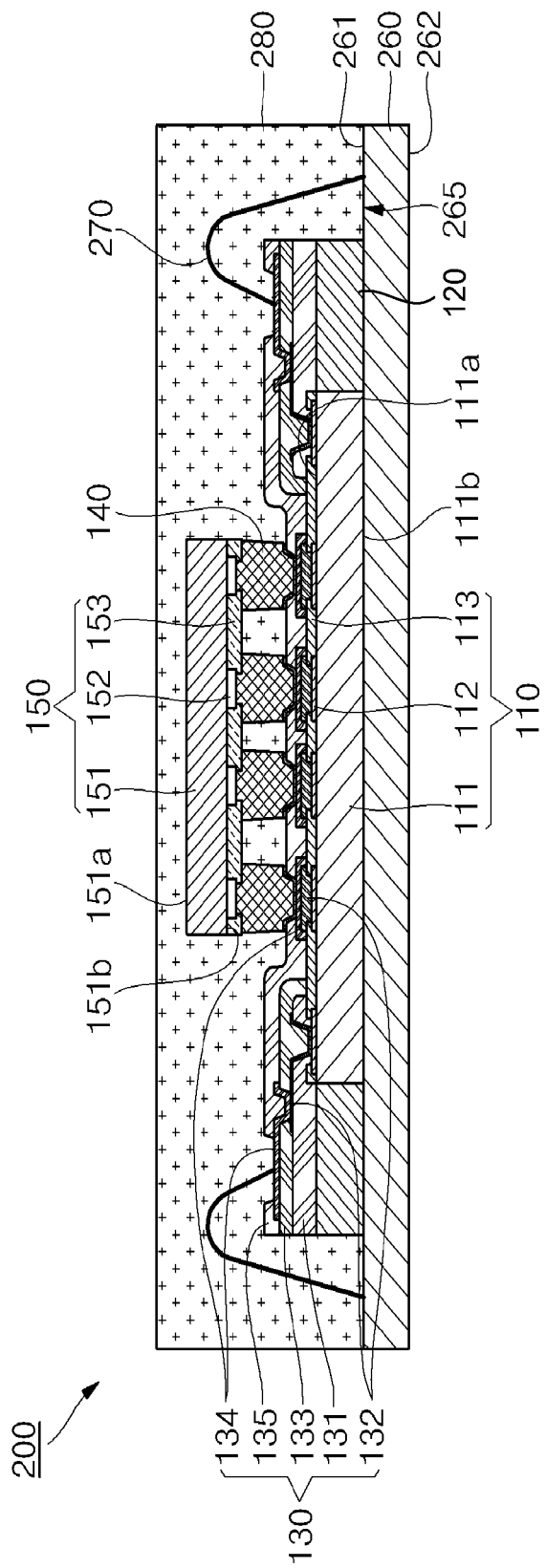
FIG. 4 is a cross-sectional view of a semiconductor package according to another example embodiment of the present invention.

FIG. 4 is a cross-sectional view of a semiconductor package according to another example embodiment of the present invention. Referring to FIG. 4, a cross-sectional view of a semiconductor package according to another embodiment of the present invention is illustrated.

As shown in FIG. 4, the semiconductor package 200 may include a first semiconductor device 110, a first encapsulant 120, redistribution layers 130, a first conductive bump 140, a second semiconductor device 150, a circuit board 260, a conductive wire 270 and a second encapsulant 280.

In the semiconductor package 200, the first semiconductor device 110, the first encapsulant 120, the redistribution layers 130, the first conductive bump 140, and the second semiconductor device 150 may be substantially similar to the semiconductor package 100 shown in FIG. 1. Thus, the following description of the semiconductor package 200 will focus on the circuit board 260, the conductive wire 270 and the second encapsulant 280, which are different from the corresponding components of the semiconductor package 100.

The board 260 may comprise a planar first surface 261 and a second surface 262 opposite to the first surface 261. The first semiconductor device 110 may be mounted on the first surface 261 of the circuit board 260. Here, the first surface 261 of the board 260 is connected to a second surface 111b of the first semiconductor device 110. The board 260 includes one or more wire bonding areas 265 formed on the first surface 261. The wire bonding areas 265 may be electrically connected to the redistribution layers 130 through the conductive wire 270. That is to say, the circuit board 260 may be electrically connected to the first semiconductor device 110 through the conductive wire 270 and the redistribution layers 130. The circuit board 260 may comprise one or more external pads (not shown) as output pads of the first semiconductor device 110 and the second semiconductor device 150, to be connected to an external board (not shown). An electrically connectable lead frame or an electrically connectable board may be used as the circuit board 260. In addition, the board 260 may be a separate semiconductor package and may provide a high-performance package by stacking semiconductor packages, but aspects of the present invention are not limited thereto.

The conductive wire 270 may electrically connect the redistribution layers 130 formed on the first surface 121 of the first encapsulant 120 and the wire bonding areas 265 of the circuit board 260 to each other. The conductive wire 270 may include a plurality of conductive wires. The conductive wire 270 may be made of one of gold (Au), aluminum (Al) and copper (Cu), or alloys thereof, but aspects of the present invention are not limited thereto.

The second encapsulant 280 may be formed to surround the first semiconductor device 110, the first encapsulant 120, the redistribution layers 130, the first conductive bump 140, the second semiconductor device 150, the conductive wire 270 and the first surface 261 of the circuit board 260. That is to say, the second encapsulant 280 may encapsulate the first semiconductor device 110, the first encapsulant 120, the redistribution layers 130, the first conductive bump 140, the second semiconductor device 150, the conductive wire 270 and the first surface 261 of the board 260, thereby protecting these components from external environments. The second encapsulant 280 may be made of the same material as the first encapsulant 120, but aspects of the present invention are not limited thereto.

Figure 5:
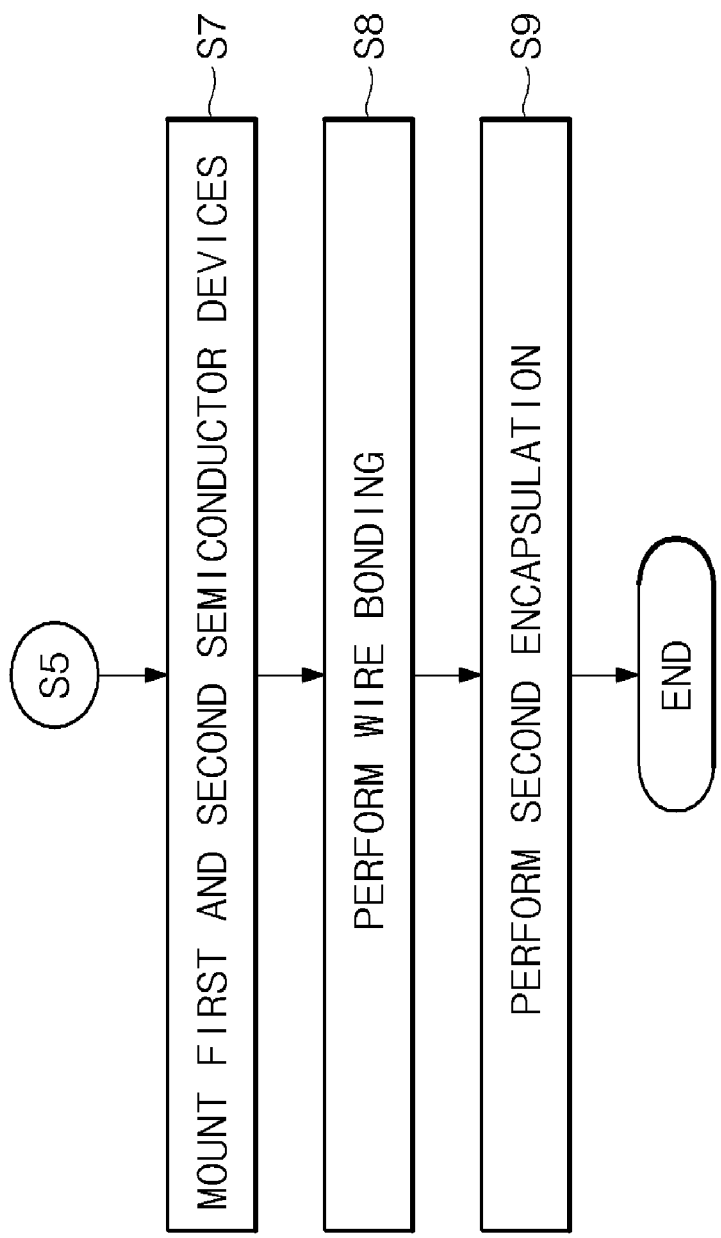
FIG. 5 is a flowchart of a manufacturing method of the semiconductor package shown in FIG. 4.

FIG. 5 is a flowchart of a manufacturing method of the semiconductor package shown in FIG. 4.

Referring to FIG. 5, a flowchart of a manufacturing method of the semiconductor package shown in FIG. 4 is illustrated.

The manufacturing method of the semiconductor package 200 includes performing first encapsulation (S1), performing back grinding (S2), forming redistribution layers (S3), forming a first conductive bump (S4), mounting a second semiconductor device (S5), mounting first and second semiconductor devices (S7), performing wire bonding (S8), and performing second encapsulation (S9).

In the manufacturing method of the semiconductor package 200, steps of performing first encapsulation (S1), performing back grinding (S2), forming redistribution layers (S3), forming a first conductive bump (S4) and mounting a second semiconductor device (S5) are substantially similar to those of the manufacturing method of the semiconductor package 100 shown in FIG. 2. Thus, the following description of the manufacturing method of the semiconductor package 200 will focus on the steps of mounting first and second semiconductor devices (S7), performing wire bonding (S8) and performing second encapsulation (S9), which are different from the corresponding process steps of the manufacturing method of the semiconductor package 100 shown in FIG. 2.

Figure 6A:
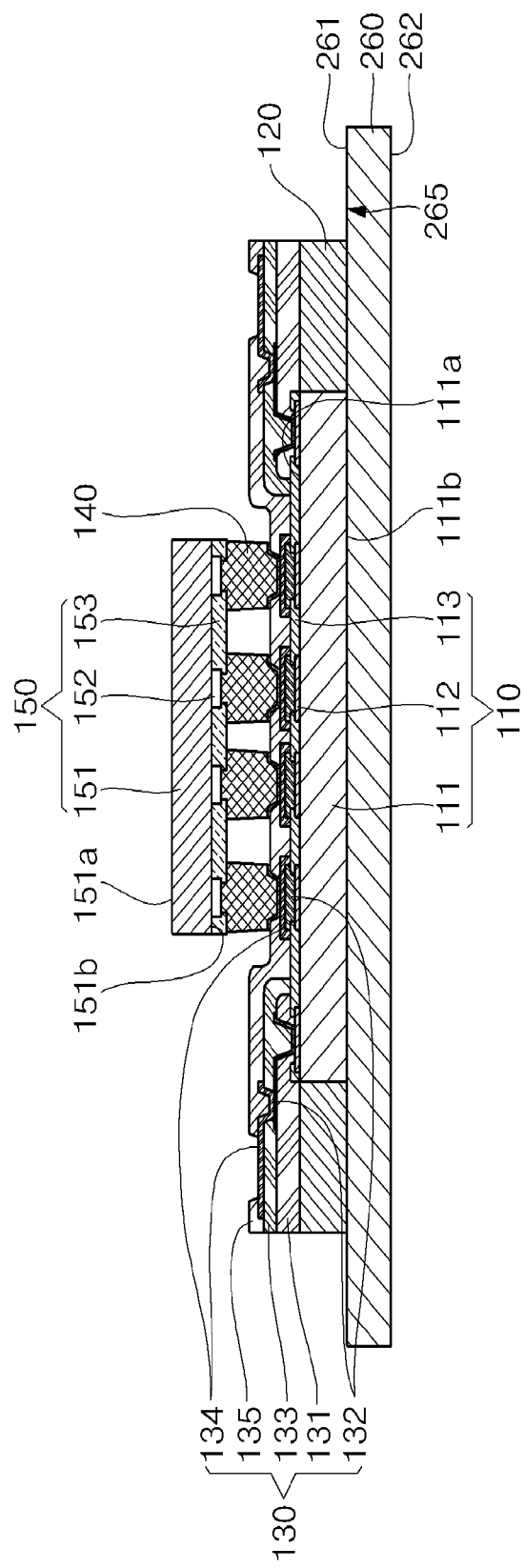
FIGS. 6A to 6C are cross-sectional views illustrating a manufacturing method of the semiconductor package shown in FIG. 5.
Figure 6B:
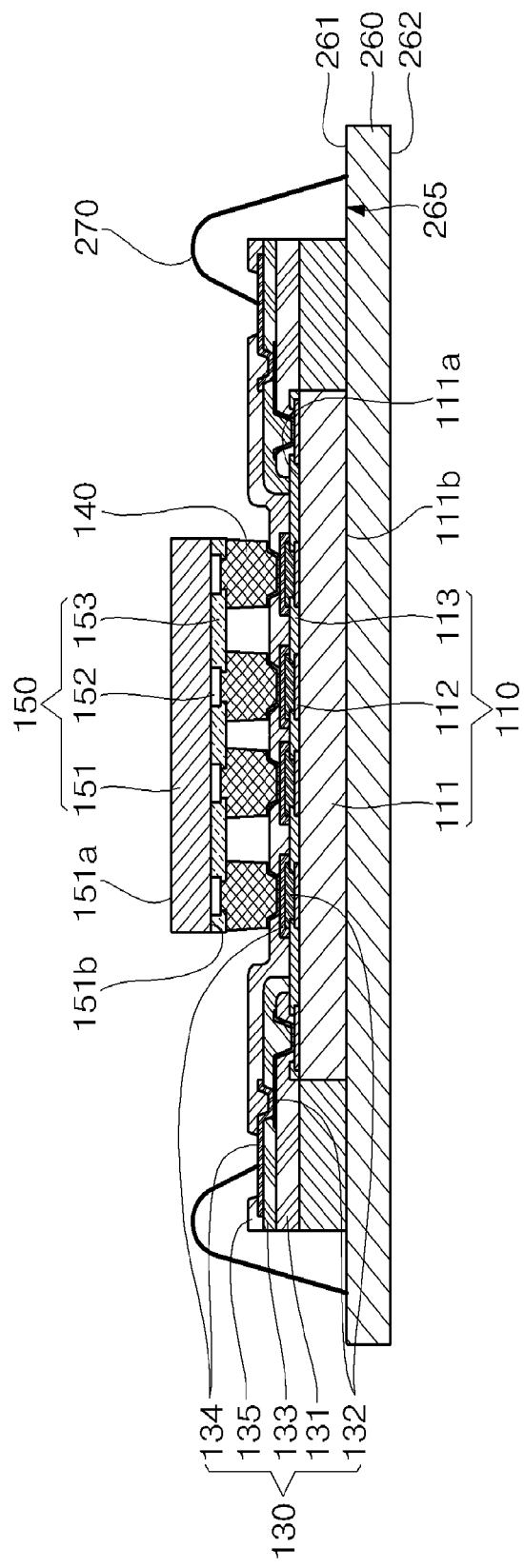
Figure 6C:
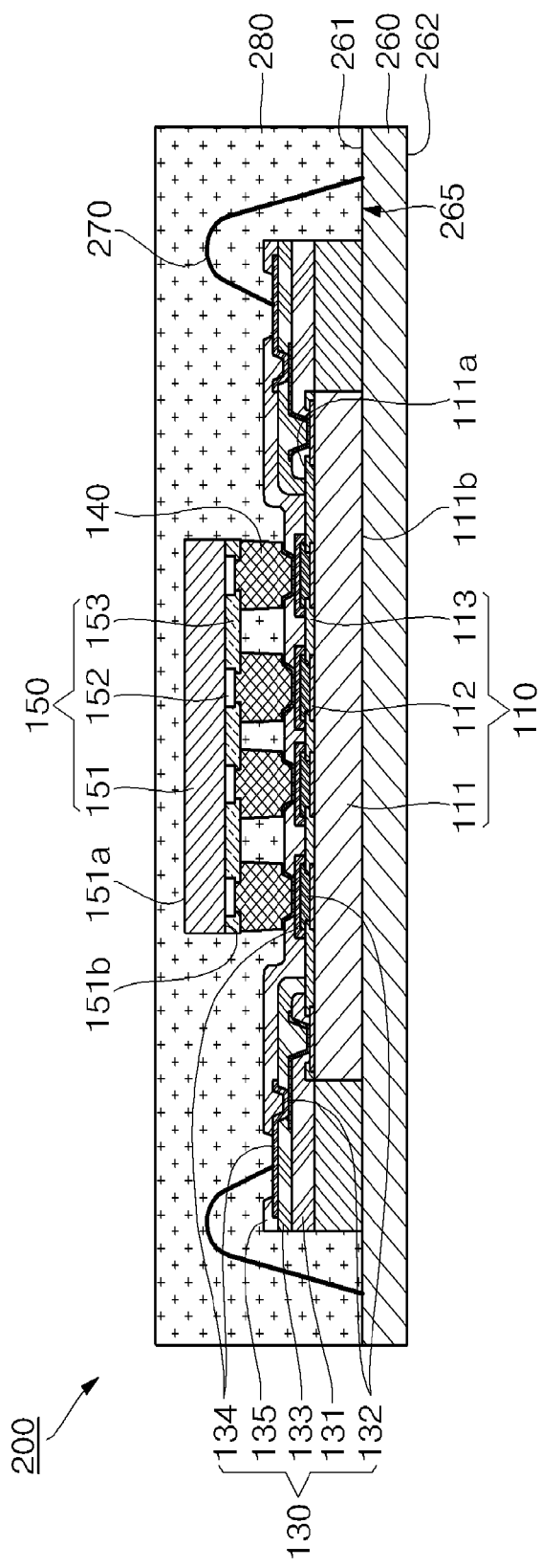

FIGS. 6A to 6C are cross-sectional views illustrating a manufacturing method of the semiconductor package shown in FIG. 5.

The manufacturing method of the semiconductor package 200 will now be described in more detail with reference to FIGS. 6A to 6C.

Referring to FIG. 6A, a cross-sectional view of the step of mounting the first and second devices (S7) in the manufacturing method of the semiconductor package 200 is illustrated. In step S7, the first semiconductor device 110 having the second semiconductor device 150 mounted thereon may be mounted on the circuit board 260. Here, the second surface 111b of the first semiconductor device 110 may be mounted on the first surface 261 of the circuit board 260. The circuit board 260 includes wire bonding areas 265 formed on the first 261 having the first semiconductor device 110 mounted thereon.

Referring to FIG. 6B, a cross-sectional view of the step of performing wire bonding (S8) in the manufacturing method of the semiconductor package 200 is illustrated. In step S8, the wire bonding areas 265 of the circuit board 260 and the redistribution layers 130 formed on the first surface 121 of the first encapsulant 120 may be bonded to be electrically connected to each other through the conductive wire 270. That is to say, in step S8, the wire bonding areas 265 of the circuit board 260 and the conductive wire 270 may be bonded, and the conductive wire 270 may be bonded with the redistribution layers 130 formed on the first surface 121 of the first encapsulant 120, thereby electrically connecting the circuit board 260 and the redistribution layers 130 by the conductive wire 270. The conductive wire 270 may include a plurality of conductive wires, which may electrically connect the redistribution layers 130 to the board 260.

Referring to FIG. 6C, a cross-sectional view of the step of performing second encapsulation (S9) in the manufacturing method of the semiconductor package 200 is illustrated. In step S9, the second encapsulant 280 may be encapsulated to surround the first semiconductor device 110, the first encapsulant 120, the redistribution layers 130, the first conductive bump 140, the second semiconductor device 150, the conductive wire 270 and the first surface 261 of the circuit board 260. As described above, the semiconductor package 200 may be protected from external environments by the second encapsulant 280 encapsulated to entirely surround a top portion of the first surface 261 of the circuit board 260, and may comprise an epoxy-series resin that is an electrically insulating material, for example.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

In an embodiment of the invention, a semiconductor package and manufacturing method thereof is disclosed and may comprise a first semiconductor device comprising a first bond pad and a second bond pad on a first surface of the first semiconductor device, a first encapsulant material surrounding side edges of the first semiconductor device, and at least one redistribution layer (RDL) formed on the first surface of the first semiconductor device and on a first surface of the encapsulant material. The at least one RDL may electrically couple the first bond pad to a third bond pad formed above the first surface of the encapsulant material. A second semiconductor device comprising a fourth bond pad on a first surface of the second semiconductor device may face the first surface of the first semiconductor device and be electrically coupled to the second bond pad on the first semiconductor device. The fourth bond pad may be electrically coupled to the second bond pad utilizing a conductive bump. The first surface of the first semiconductor device may be coplanar with the first surface of the encapsulant material. A conductive bump formed on the third bond pad may be electrically coupled to the first bond pad via the at least one RDL. The first semiconductor device may comprise a logic chip and the second semiconductor device may comprise a memory chip. A second surface of the first semiconductor device opposite to the first surface may be coupled to a circuit board. A conductive wire may electrically couple the third bond pad to a bonding area on the circuit board. The first semiconductor die, the at least one RDL, the second semiconductor device, and the top surface of the circuit board may be covered with a second encapsulant material. The first and second encapsulant materials may comprise an epoxy-series resin.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor package comprising:
   a first semiconductor device comprising a first bond pad and a second bond pad, the first bond pad and the second bond pad above a first surface of the first semiconductor device;
   a first encapsulant material surrounding side edges of the first semiconductor device;
   a first dielectric layer above the first encapsulant material and extending over the first bond pad but exposing a portion of the first surface of the first semiconductor device;
   a second dielectric layer above the first surface of the first semiconductor device, wherein a first portion of the second dielectric layer is above the first dielectric layer and a second portion of the second dielectric layer is above the exposed portion of the first semiconductor device, and wherein a top surface of the second portion of the second dielectric layer is below a bottom surface of the first portion of the second dielectric layer;

at least one redistribution layer (RDL) above the first surface of the first semiconductor device, above the first dielectric layer, and under the first portion of the second dielectric layer, the at least one RDL electrically coupling the first bond pad to a third bond pad that is above a first surface of the first encapsulant material; and a second semiconductor device comprising a fourth bond pad coupled to a first surface of the second semiconductor device, said first surface of the second semiconductor device facing the first surface of the first semiconductor device and said fourth bond pad being electrically coupled to the second bond pad above the first semiconductor device.

2. The package according to claim 1, wherein the fourth bond pad is electrically coupled to the second bond pad utilizing a conductive bump.

3. The package according to claim 1, wherein the first surface of the first semiconductor device is coplanar with the first surface of the first encapsulant material.

4. The package according to claim 1, wherein a conductive bump formed above the third bond pad is electrically coupled to the first bond pad above the first semiconductor device via the at least one RDL.

5. The package according to claim 1, wherein the first semiconductor device comprises a logic chip and the second semiconductor device comprises a memory chip.

6. The package according to claim 1, wherein the first semiconductor device comprises one of: a sensor die, a micro-electro-mechanical (MEMS) device, a power management chip, a logic chip, and a memory chip and the second semiconductor device comprises a different one of: a sensor die, a micro-electro-mechanical system (MEMS) device, a power management chip, a logic chip, and a memory chip.

7. The package according to claim 1, wherein a second surface of the first semiconductor device opposite to the first surface is coupled to a circuit board.

8. The package according to claim 7, wherein a conductive wire electrically couples the third bond pad to a bonding area on the circuit board.

9. The package according to claim 1, wherein the first semiconductor device, the at least one RDL, the second semiconductor device, and the top surface of the circuit board are covered with a second encapsulant material.

10. The package according to claim 9, wherein the first and second encapsulant materials comprise an epoxy-series resin.

11. A method for semiconductor packaging, the method comprising:
providing a first semiconductor device comprising a first bond pad and a second bond pad above a first surface of the first semiconductor device;
providing a first encapsulant material that surrounds side edges of the first semiconductor device;
providing a first dielectric layer on the first encapsulant material and extending over the first bond pad but exposing a portion of the first surface of the first semiconductor device;
providing a second dielectric layer above the first surface of the first semiconductor device, wherein a first portion of the second dielectric layer is above the first dielectric layer and a second portion of the second dielectric layer is above the exposed portion of the first semiconductor device, and wherein a top surface of the second portion of the second dielectric layer is below a bottom surface of the first portion of the second dielectric layer;
providing at least one redistribution layer (RDL) above the first surface of the first semiconductor device, above the first dielectric layer, and under the second dielectric layer, the at least one RDL electrically coupling the first bond pad to a third bond pad that is above a first surface of the first encapsulant material; and
providing a second semiconductor device comprising a fourth bond pad coupled to a first surface of the second semiconductor device, said first surface of the second semiconductor device facing the first surface of the first semiconductor device and said fourth bond pad being electrically coupled to the second bond pad above the first semiconductor device.

12. The method according to claim 11, comprising electrically coupling the fourth bond pad to the second bond pad utilizing a conductive bump.

13. The method according to claim 11, wherein the first surface of the first semiconductor device is coplanar with the first surface of the first encapsulant material.

14. The method according to claim 11, comprising electrically coupling a conductive bump that is above the third bond pad to the first bond pad above the first semiconductor device via the at least one RDL.

15. The method according to claim 11, wherein the first semiconductor device comprises a logic chip and the second semiconductor device comprises a memory chip.

16. The method according to claim 11, wherein the first semiconductor device comprises one of: a sensor die, a micro-electro-mechanical (MEMS) device, a power management chip, a logic chip, and a memory chip and the second semiconductor device comprises a different one of: a sensor die, a micro-electro-mechanical system (MEMS) device, a power management chip, a logic chip, and a memory chip.

17. The method according to claim 11, comprising coupling a second surface of the first semiconductor device opposite to the first surface to a circuit board.

18. The method according to claim 17, comprising electrically coupling the third bond pad to a bonding area on the circuit board utilizing a conductive wire.

19. The method according to claim 11, comprising covering the first semiconductor device, the at least one RDL, the second semiconductor device, and the top surface of the circuit board with a second encapsulant material.

20. A semiconductor package comprising:
a first semiconductor device comprising a first plurality and second plurality of bond pads, the first plurality of bond pads and the second plurality of bond pads above a first surface of the first semiconductor device;
an encapsulant material surrounding side edges of the first semiconductor device with a first surface of the encapsulant material being coplanar with the first surface of the first semiconductor device;
a first dielectric layer above the first surface of the encapsulant material and extending over the first bond pad but exposing a portion of the first surface of the first semiconductor device;
a second dielectric layer above the first surface of the first semiconductor device, wherein a first portion of the second dielectric layer is above the first dielectric layer and a second portion of the second dielectric layer is above the exposed portion of the first semiconductor device, and wherein a top surface of the second portion of the second dielectric layer is below a bottom surface of the first portion of the second dielectric layer;
a plurality of redistribution layers (RDLs) above the first surface of the first semiconductor device, above the first dielectric layer, and under the second dielectric layer, the plurality of RDLs electrically coupling the first plurality of bond pads to a third plurality of bond pads that are above the first surface of the encapsulant material;

a second semiconductor device comprising a fourth plurality of bond pads coupled to a first surface of the second semiconductor device, said first surface of the second semiconductor device facing the first surface of the first semiconductor device and the fourth plurality of bond pads being electrically coupled to the second plurality of bond pads above the first semiconductor device utilizing conductive bumps; and a plurality of wire bonds coupling the third plurality of bond pads to bonding areas on a circuit board, said circuit board being coupled to the encapsulant material and the first semiconductor device.

21. The package according to claim 20, wherein the fourth plurality of bond pads is electrically coupled to the second plurality of bond pads utilizing conductive bumps.

22. The package according to claim 20, wherein the first surface of the first semiconductor device is coplanar with the first surface of the encapsulant material.

23. The package according to claim 20, comprising conductive bumps above the third plurality of bond pads.

24. The package according to claim 20, wherein the conductive bumps are electrically coupled to the first plurality of bond pads above the first semiconductor device via the plurality of RDLs.

25. The package according to claim 20, wherein the first semiconductor device comprises a logic chip and the second semiconductor device comprises a memory chip.

26. The package according to claim 21, wherein the first semiconductor device comprises one of: a sensor die, a micro-electro-mechanical (MEMS) device, a power management chip, a logic chip, and a memory chip and the second semiconductor device comprises a different one of: a sensor die, a micro-electro-mechanical system (MEMS) device, a power management chip, a logic chip, and a memory chip.

27. The package according to claim 21, wherein a second surface of the first semiconductor device opposite to the first surface is coupled to a circuit board.

28. The package according to claim 27, wherein conductive wires electrically couple the third plurality of bond pads to bonding areas on the circuit board.

29. A semiconductor package comprising:
a first semiconductor device comprising a first bond pad and a second bond pad, the first bond pad and the second bond pad being on a first surface of the first semiconductor device;
an encapsulant material surrounding side edges of the first semiconductor device;
a first dielectric layer on a first surface of the encapsulant material and extending over the first bond pad but exposing a portion of the first surface of the first semiconductor device;
a second dielectric layer above the first surface of the first semiconductor device, wherein a first portion of the second dielectric layer above the first dielectric layer and a second portion of the second dielectric layer is above the exposed portion of the first semiconductor device, and wherein a top surface of the second portion of the second dielectric layer is below a bottom surface of the first portion of the second dielectric layer;
at least one redistribution layer (RDL) above the first surface of the first semiconductor device, on the first dielectric layer, and under the second dielectric layer, the at least one RDL electrically coupling the first bond pad to a third bond pad that is above the first surface of the encapsulant material;
a second semiconductor device comprising a fourth bond pad above a first surface of the second semiconductor device, said first surface of the second semiconductor device facing the first surface of the first semiconductor device and said fourth bond pad being electrically coupled to the second bond pad above the first semiconductor device; and
a wire bond coupling the third bond pad to a bonding area on a circuit board.

* * * * *